United States Patent
Schneider

(10) Patent No.: US 10,345,831 B2
(45) Date of Patent: Jul. 9, 2019

(54) METHODS AND SYSTEMS FOR USING A TAPPED TRANSFORMER TO GENERATE VOLTAGE SAGS

(71) Applicant: ROCKWELL AUTOMATION TECHNOLOGIES, INC., Mayfield Heights, OH (US)

(72) Inventor: Robert S. Schneider, Middleton, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 217 days.

(21) Appl. No.: 15/282,265

(22) Filed: Sep. 30, 2016

(65) Prior Publication Data

US 2018/0095485 A1   Apr. 5, 2018

(51) Int. Cl.
*G05F 1/14* (2006.01)
*G05F 1/16* (2006.01)

(52) U.S. Cl.
CPC . *G05F 1/14* (2013.01); *G05F 1/16* (2013.01)

(58) Field of Classification Search
CPC . G05F 1/14; G05F 1/147; G05F 1/153; G05F 1/16; G05F 1/20; H01F 30/02; H01F 30/12
See application file for complete search history.

(56) References Cited

U.S. PATENT DOCUMENTS

| | | | |
|---|---|---|---|
| 5,920,132 A | 7/1999 | Rockfield et al. | |
| 6,011,381 A * | 1/2000 | Andrei | G05F 1/14 323/215 |
| 6,285,169 B1 | 9/2001 | McEachern | |
| 6,525,951 B1 * | 2/2003 | Paice | H01F 30/14 363/153 |
| 7,218,122 B1 | 5/2007 | Nastasi et al. | |
| 7,535,738 B2 * | 5/2009 | Wei | H02M 5/458 363/34 |
| 7,929,322 B2 | 4/2011 | Gonzalez et al. | |

(Continued)

OTHER PUBLICATIONS

IEC 61000-4-34, Electromagnetic compatibility (EMC), Part 4-34: Testing and measurement techniques—Voltage dips, short interruptions and voltage variations immunity tests for equipment with mains current more than 16 A per phase, International Electrotechnical Commission, 2009.

(Continued)

*Primary Examiner* — Matthew V Nguyen
(74) *Attorney, Agent, or Firm* — Foley & Lardner LLP

(57) ABSTRACT

A device includes a three phase supply input including a first phase input, a second phase input, and a third phase input. The device further includes a three phase supply output including a first phase output, a second phase output, and a third phase output. The device further includes a three-phase wye-connected auto-transformer having windings including a first winding, a second winding, and a third winding. At least one of the windings is rated for at least a maximum line to line voltage of the three phase supply input. The other two windings are rated for at least a maximum line to neutral voltage of the three phase supply input. One or more of the windings of the three-phase wye-connected auto-transformer are configured to be tapped to generate a voltage sag output as the three phase supply output.

20 Claims, 14 Drawing Sheets

(56) References Cited

U.S. PATENT DOCUMENTS

2015/0069955 A1* 3/2015 Xu .................... H01F 30/12
                                                         320/107
2017/0085169 A1* 3/2017 Kravitz ............... H02M 1/126

OTHER PUBLICATIONS

SEMI F47-0706, Specification for semiconductor processing equipment voltage sag immunity, Semi, Jun. 2006.

* cited by examiner

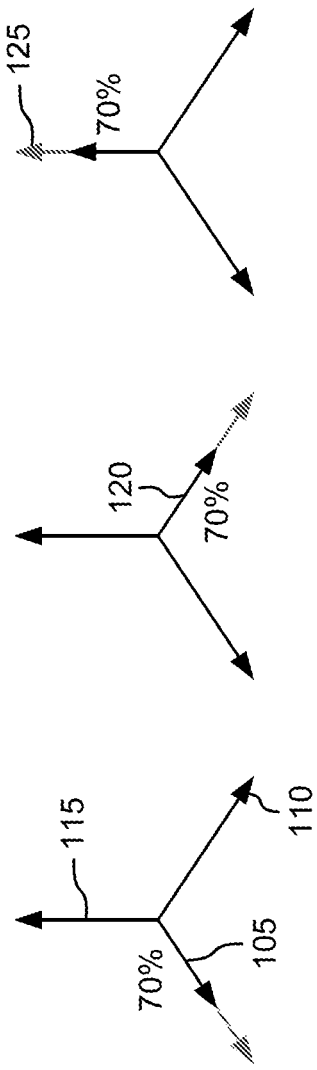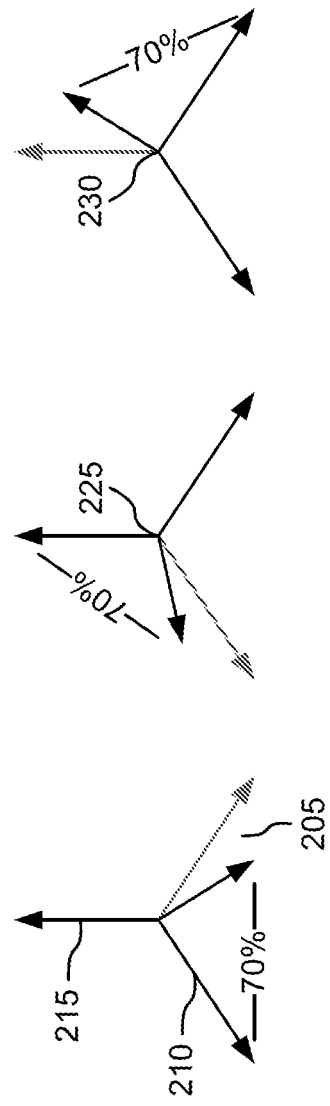
FIG. 1
FIG. 2

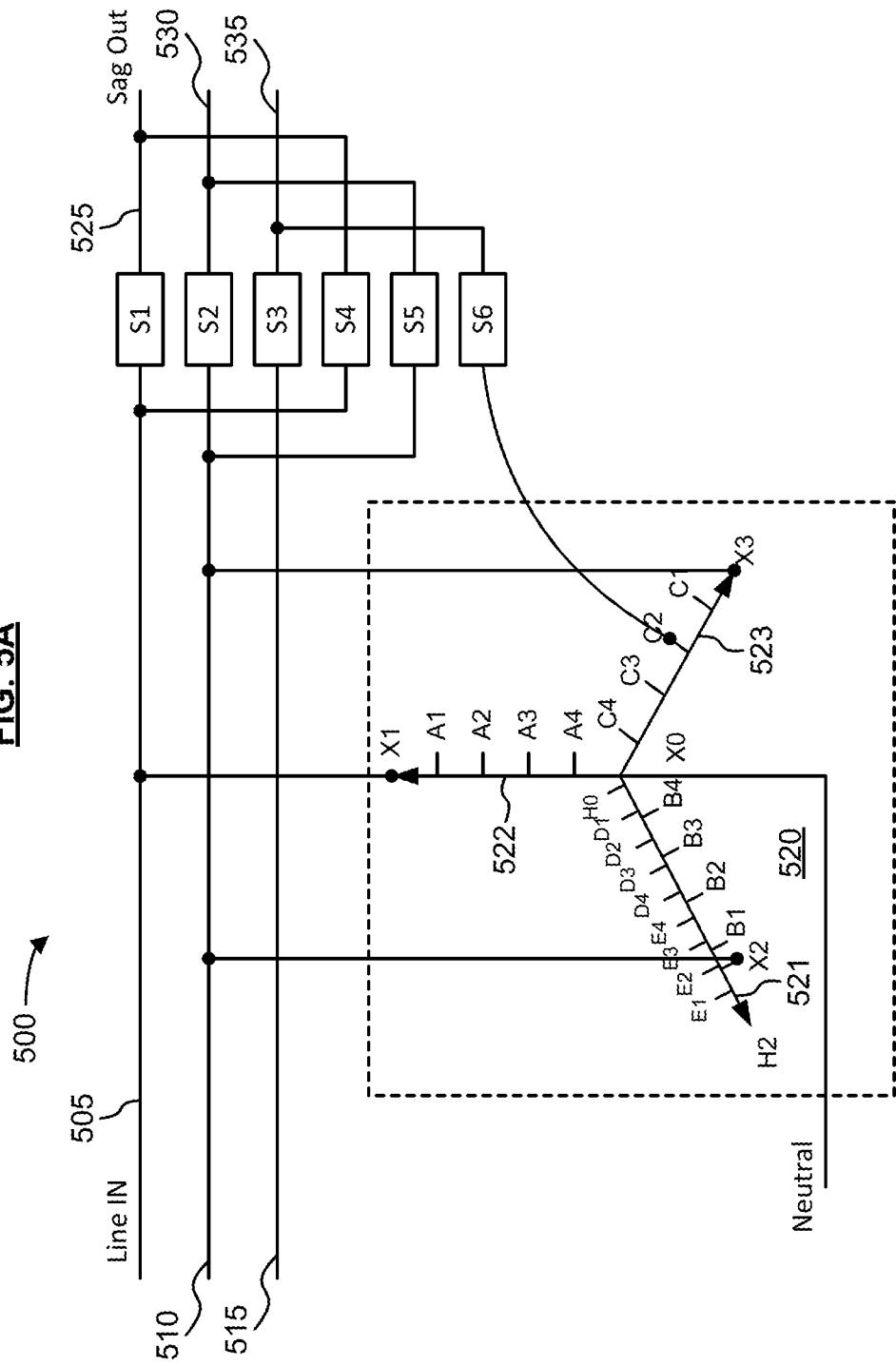

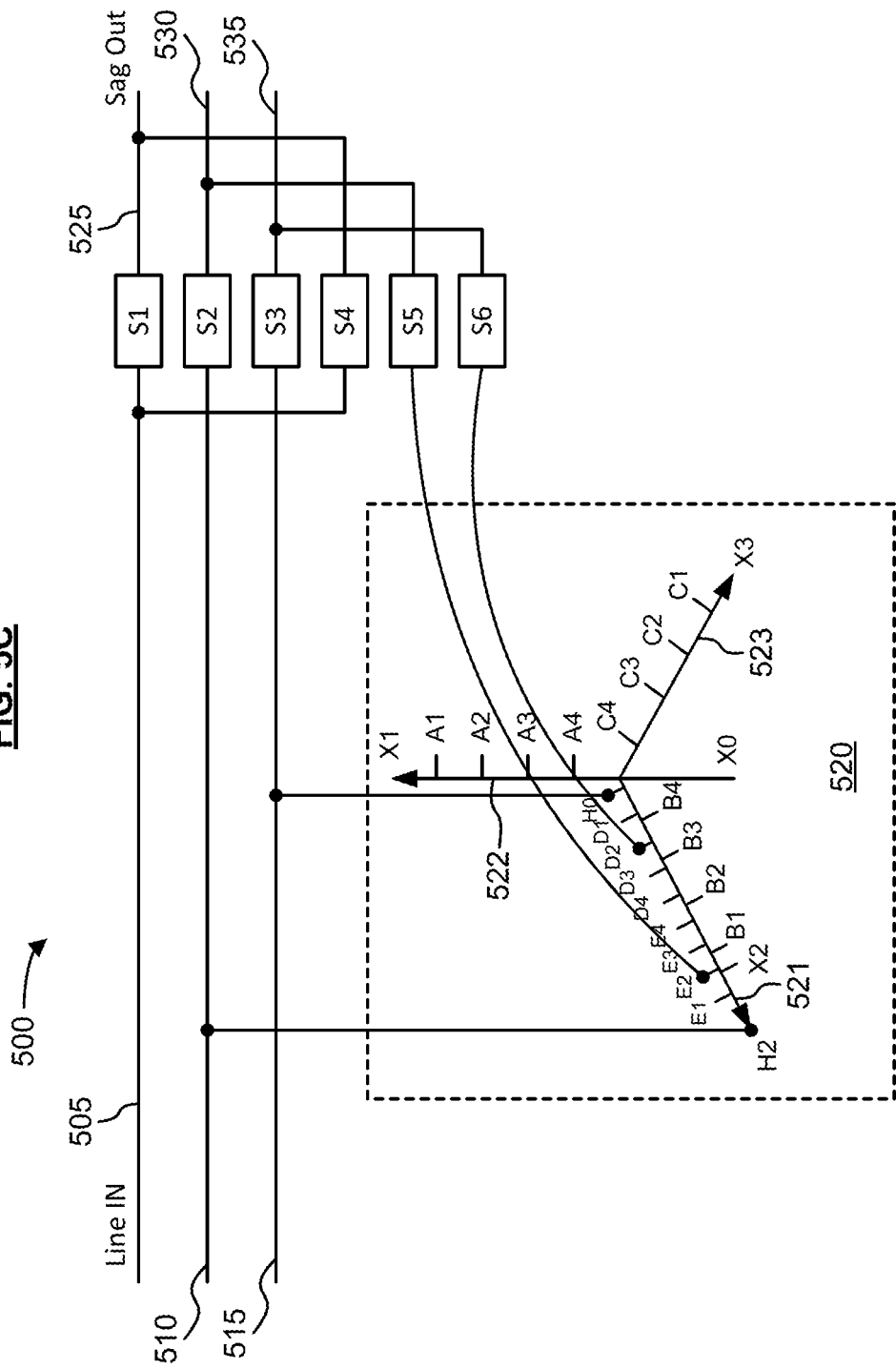

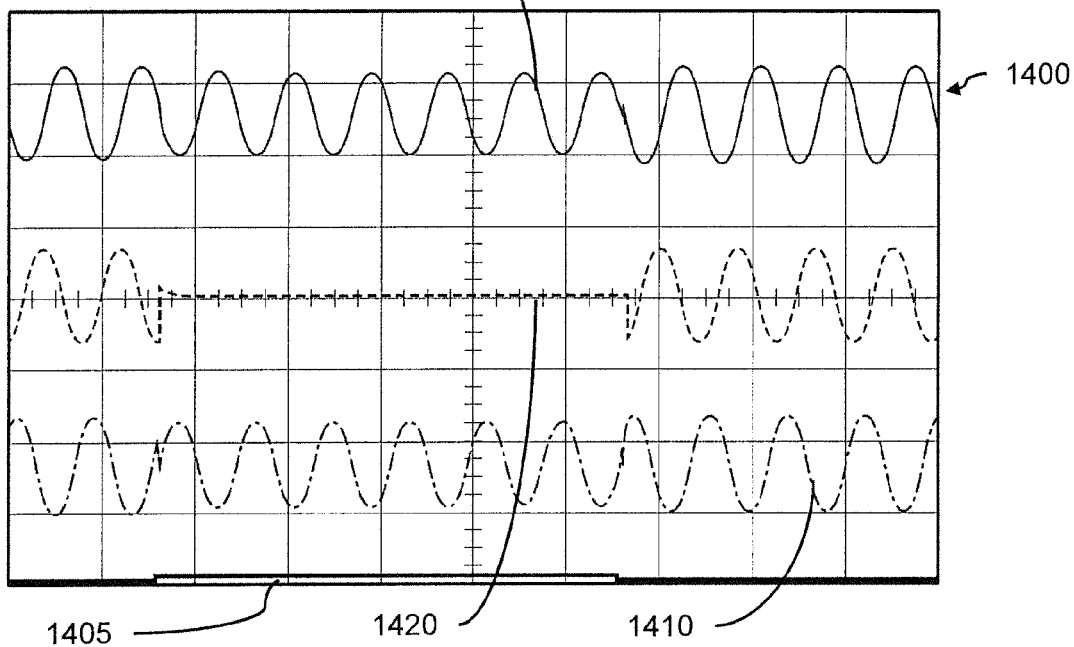
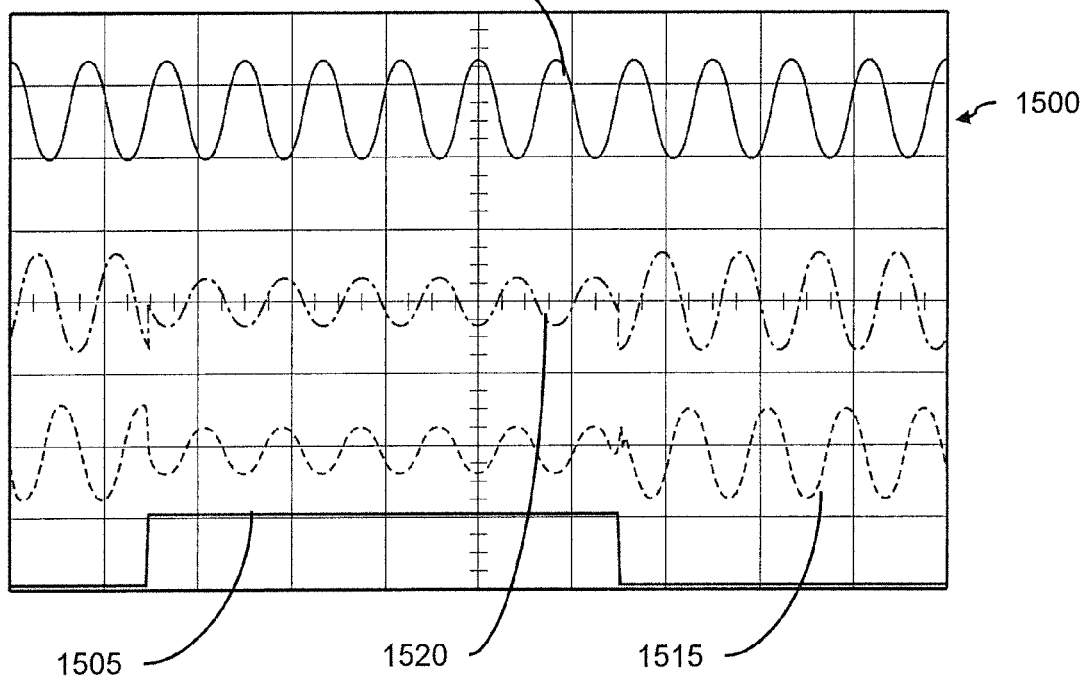

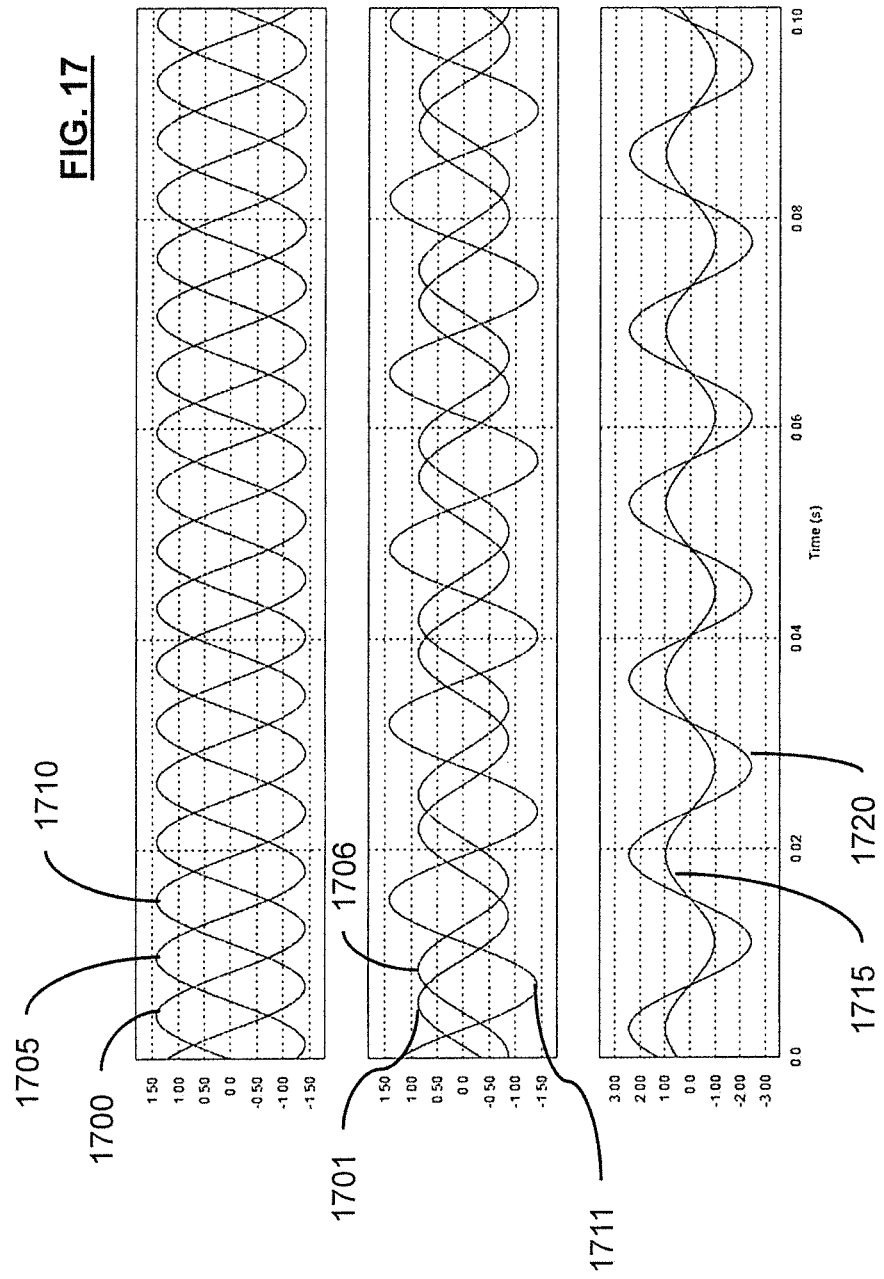

METHODS AND SYSTEMS FOR USING A TAPPED TRANSFORMER TO GENERATE VOLTAGE SAGS

BACKGROUND

An electrical load which receives power through an AC power system is generally designed to operate reliably when the actual supply input voltage is within approximately 10% of the rated supply input voltage. A voltage sag (or dip) can refer to a temporary reduction of the rms AC voltage in which the actual supply input voltage is below approximately 90% of the rated supply input voltage, for example. Voltage sags can be caused by various reasons, such as startup of a large load within a facility, a circuit fault, a fault on the utility transmission or distribution system, a problem with a generator, or any of a number of other reasons. Voltage sags can cause difficulties in industrial manufacturing facilities or other facilities with heavy machinery. For example, voltage sags can cause equipment to shut down and/or be damaged. Such instances can be costly due to down time, repair, and/or replacement of machinery due to voltage sags. Accordingly, voltage-sag testing can be used to determine the voltage tolerance of certain equipment.

SUMMARY

An illustrative device includes a three phase supply input including a first phase input, a second phase input, and a third phase input. The device further includes a three phase supply output including a first phase output, a second phase output, and a third phase output. The device further includes a three-phase wye-connected auto-transformer having windings including a first winding, a second winding, and a third winding. At least one of the windings is rated for at least a maximum line to line voltage of the three phase supply input. The other two windings are rated for at least a maximum line to neutral voltage of the three phase supply input. One or more of the windings of the three-phase wye-connected auto-transformer are configured to be tapped to generate a voltage sag output as the three phase supply output.

An illustrative method includes receiving a three phase supply input that includes a first phase input, a second phase input, and a third phase input. The method further includes generating, with a three-phase wye-connected auto-transformer, a voltage sag at a three phase supply output. The three phase supply output includes a first phase output, a second phase output, and a third phase output. The three-phase wye-connected auto-transformer has windings including a first winding, a second winding, and a third winding. At least one of the windings is rated for at least a maximum line to line voltage of the three phase supply input. The other two windings are rated for at least a maximum line to neutral voltage of the three phase supply input. One or more of the windings of the three-phase wye-connected auto-transformer are tapped to generate the voltage sag.

An illustrative non-transitory computer readable medium having instructions stored thereon that, upon execution by a computing device, cause the computing device to perform operations. The instructions include instructions to receive a three phase supply input including a first phase input, a second phase input, and a third phase input. The instructions further include instructions to give commands to a set of switches to generate, with a three-phase wye-connected auto-transformer, a voltage sag as a three phase supply output. The three phase supply output includes a first phase output, a second phase output, and a third phase output. The three-phase wye-connected auto-transformer has windings including a first winding, a second winding, and a third winding. At least one of the windings is rated for at least a maximum line to line voltage of the three phase supply input. The other two windings are rated for at least a maximum line to neutral voltage of the three phase supply input. One or more of the windings of the three-phase wye-connected auto-transformer are tapped to generate the voltage sag.

BRIEF DESCRIPTION OF THE DRAWINGS

Illustrative embodiments will hereafter be described with reference to the accompanying drawings.

FIG. 1 is a diagram illustrating a first type of voltage sag condition in accordance with an illustrative embodiment.

FIG. 2 is a diagram illustrating a second type of voltage sag condition in accordance with an illustrative embodiment.

FIG. 5A is a circuit diagram illustrating a sag generator device with a three-phase wye-connected tapped auto-transformer for generating a Type A voltage sag in accordance with an illustrative embodiment.

FIG. 5C is a circuit diagram illustrating a sag generator device with a three-phase wye-connected tapped auto-transformer for generating a Type C voltage sag in accordance with an illustrative embodiment.

FIG. 14 is a graph illustrating an alternate view of a generated line-to-line voltage sag in accordance with an illustrative embodiment.

FIG. 15 is a graph illustrating an alternate view of load currents during a generated line-to-line voltage sag in accordance with an illustrative embodiment.

FIG. 17 is a graph illustrating simulated voltage results of a voltage sag generator in accordance with an illustrative embodiment.

DETAILED DESCRIPTION

Figure 3:
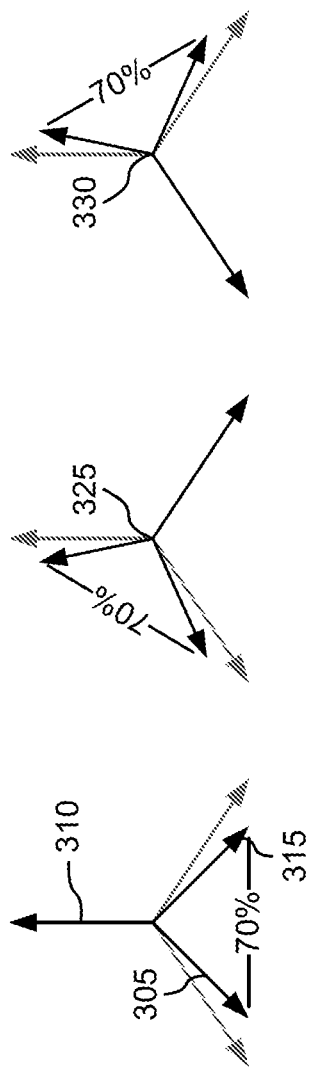
FIG. 3 is a diagram illustrating a third type of voltage sag condition in accordance with an illustrative embodiment.

Disclosed herein are illustrative systems and methods for generating a voltage sag. Such systems and methods are valuable for testing various equipment's' sag tolerances, including heavy industrial machinery, larger three phase motors, and voltage sag protection equipment (such as that shown in U.S. Pat. No. 7,920,392, which is incorporated herein by reference in its entirety).

In particular, there are different types of voltage sags that may occur and may be tested for. Various embodiments disclosed herein include systems and methods that can effectively generate sags of different types so that equipment can be properly tested. Advantageously, these different types of sags can generated be with a device that has a single transformer as disclosed herein. Furthermore, the various tests described below can be performed with a single device, rather than multiple devices. Another advantage of the devices disclosed herein is that they are simpler and contain fewer components than other methods of voltage sag generation and testing. Still another advantage of using the devices and methods disclosed herein is that they can generate sags for very heavy machinery. As just one example, devices disclosed herein may generate sags for equipment that typically runs using currents of up to 2,500 Amps or more. Accordingly, using, building, and maintaining is cheaper and easier. Furthermore, various standards bodies, including Semiconductor Equipment and Materials International (SEMI), the International Electrotechnical Commission (IEC), and the Institute of Electrical and Electronics Engineers (IEEE) have set standards with respect to what types of voltage sags should be tested for to meet their standards.

FIG. 1 is a diagram illustrating a first type of voltage sag condition in accordance with an illustrative embodiment. FIG. 1 shows voltage phasor vectors during a phase-to-neutral sag condition on a three phase system. Here each phase is tested one at a time. A first phase 105 is reduced, while a second phase 110 and a third phase 115 are maintained. A second phase 120 and a third phase 125 can also be tested. Here, the voltages of each phase are reduced to 70% of their normal voltage for the test. However, other voltages are possible. In the SEMI F47-0706 standard, this test is referred to as a Type A sag. The IEC 61000-4-34 standard refers to this as Sag Method 1.

Figure 4:
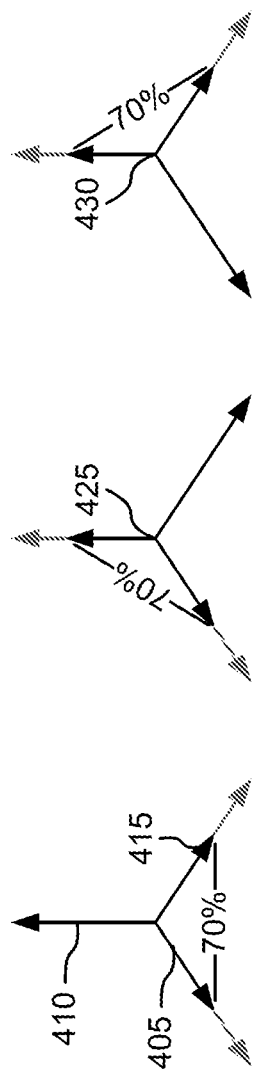
FIG. 4 is a diagram illustrating a fourth type of voltage sag condition in accordance with an illustrative embodiment.

FIG. 2 is a diagram illustrating a second type of voltage sag condition in accordance with an illustrative embodiment. FIG. 3 is a diagram illustrating a third type of voltage sag condition in accordance with an illustrative embodiment. FIG. 4 is a diagram illustrating a fourth type of voltage sag condition in accordance with an illustrative embodiment. Each of FIGS. 2-4 demonstrate various phase-to-phase voltage sag testing options. The SEMI F47-0706 standard refers to these sags as Types B, C, and D, respectively. The IEC 61000-4-34 standard refers to them as Sag Methods 2, 3, and 4, respectively. Hereinafter, the types of sags will be referred to using the SEMI F47-0706 nomenclature (i.e., Type A, Type B, Type C, and Type D). Accordingly, FIG. 2 shows a Type B sag, FIG. 3 shows a Type C sag, and FIG. 4 shows a Type D sag. The SEMI F47-0706 standard allows equipment to be tested with any of Types B, C, or D. Types B and C require a phase shift and voltage magnitude reduction, while Type D merely requires a voltage magnitude reduction on two phases (and no phase shift). The IEC 61000-4-34 standard allows Types B and C sag tests, but does not allow Type D. In other words, IEC 61000-4-34 requires a phase shift for phase-to-phase testing. Additionally, Types B and C tests are permitted by both IEC 61000-4-34 and SEMI F47-0706. Advantageously, the systems and methods disclosed herein can generate each of Types A, B, C, and D sags in order to perform voltage sag testing. The systems and methods herein can also be used to generate other types of sags than the Types A, B, C, and D.

FIG. 2, the Type B sag, shows a sag and phase shift on one phase (phase 205). The other phases 210 and 215 are not sagged or phase shifted for a Type B. Vectors 225 and 230 demonstrate a similar test for a second and third phase.

FIG. 3, the Type C sag, shows a two phase sag where both phases also are phase shifted. In particular, phases 305 and 315 are shifted and sagged, while a third phase 310 is not shifted or sagged. Vectors 325 and 330 show the combination of Type C sags for the other phases. One way to produce this type of sag is to pass a generated Type A sag (FIG. 1) through a delta-wye isolation transformer. However, this method uses two transformers leading to greater expense, complexity, and footprint as opposed to a method using a single transformer. Additionally, when the primary of a delta-wye isolation transformer is exposed to a step in voltage as produced by Sag Method 1, it is subject to drawing large inrush currents. An AC supply and switches are then rated to handle such an inrush. At high powers, the sizing penalty can be significant. Accordingly, a system with a single transformer is further advantageous.

FIG. 4, the Type D sag, shows a phase 405 and a phase 415 sagging but not phase shifted, while phase 410 is not sagged nor shifted. Vectors 425 and 430 show other configurations of the Type D sag.

FIGS. 5A-5D are circuit diagrams illustrating a sag generator device 500 with a three-phase wye-connected tapped auto-transformer and switches for generating voltage sags of different types in accordance with illustrative embodiments. Such a device is advantageously capable of generating Types A, B, C, and D sags with a single transformer device, thus allowing it to generate all types of sags required by both SEMI F47-0706 and IEC 61000-4-34.

Figure 5B:
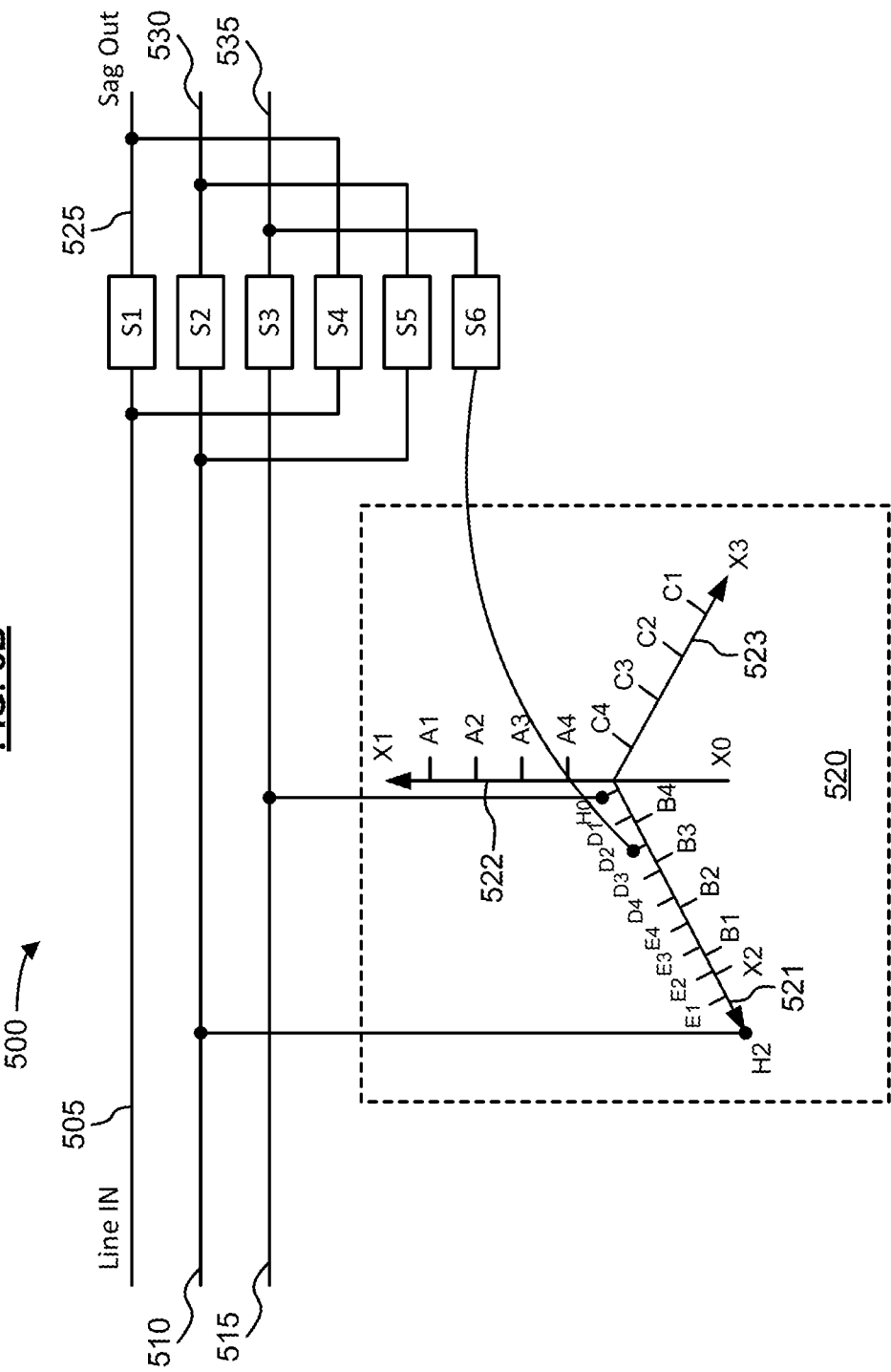
FIG. 5B is a circuit diagram illustrating a sag generator device with a three-phase wye-connected tapped auto-transformer for generating a Type B voltage sag in accordance with an illustrative embodiment.

The device 500 includes a three phase supply input that includes a first phase input 505, a second phase input 510, and a third phase input 515. The device 500 further includes switches S1, S2, S3, S4, S5, and S6. The switches are controlled in two groups: a first group (S1, S2, S3) and a second group (S4, S5, S6). When a sag is not being generated (a normal condition), the first group of switches is on (and the second group of switches is controlled to be off) so that signals from the first phase input 505, the second phase input 510, and the third phase input 515 are passed directly to a three phase supply output that includes a first phase output 525, a second phase output 530, and a third phase output 535. The three phase supply output can supply or be connected to a resistive three phase load, such as a three phase motor or any other kind of three phase device. When a sag is being generated (a sag condition), the second group of switches is on (and the first group of switches is controlled to be off). In the example in FIG. 5A, the signals from the first phase input 505 and the second phase input 510 are passed through switches S4 and S5 (instead of switches S1 and S2 during the normal condition) to the first phase output 525 and the second phase output 530, respectively. Further in the example of FIG. 5A, the third phase input 515 is passed through a third winding 523 of a transformer 520, through the switch S6 (instead of the switch S3 during the normal condition), and then to the third phase output 535 to generate a sag to the third phase output 535. This and other examples of how the switches may be used and configured with the transformer 520 are described below with respect to FIGS. 5A-5D. In some embodiments, some of the switches may be omitted to further simplify the device. For example, when generating a Type C sag as shown in FIG. 5C below or a Type D sag as in FIG. 5D, S4 and/or S1 may be omitted, and the first phase input 505 may be permanently directly connected to the first phase output 525 (with no intervening switches). In another example, when generating a Type A sag as in FIG. 5A or a Type B sag as in FIG. 5B, any of S1, S2, S5, and S6 may be omitted, and the first phase input 505 may be permanently directly connected to the first phase output 525, as well as the second phase input 510 may be permanently directly connected to the second phase output 530.

The transformer 520 is configured as a three-phase wye-connected auto-transformer. The transformer 520 may be advantageously built with cost-effective three phase transformer construction using a three legged iron core. A first winding 521 of the transformer 520 is wound on the center-leg of the transformer core. The first winding 521 is rated such that the full rated line-line voltage can be applied to the first winding 521. A second winding 522 and a third winding 523 are wound on the outer-legs of the transformer core. The second and third windings 522 and 523 are constructed such that the line-neutral voltage can be applied to these windings. In other embodiments, the second and third windings 522 and 523 may be rated higher (e.g., such that the full rated line-line voltage can be applied to the second and third windings 522 and 523). Further, in some embodiments, the first winding could be wound on any leg of the transformer rather than the center leg. The first winding 521, second winding 522, and third winding 523 include taps corresponding to the magnitude of the voltage remaining during the voltage sag that is required. Such taps may be fixed or adjustable in various embodiments. As discussed herein, these taps can be used to generate a voltage sag, such as Type A, B, C, D, or other types of sags.

FIG. 5A is a circuit diagram illustrating a sag generator device 500 with the three-phase wye-connected tapped auto-transformer 520 for generating a Type A voltage sag in accordance with an illustrative embodiment. To produce a Type A sag, the three-phase wye is connected to the AC supply. The first phase input 505 is connected to the second winding 522 at a tap X1, the second phase input 510 is connected to the first winding 521 at a tap X2, and the third phase input 515 is connected to the third winding 523 at a tap X3. In FIG. 5A, a Type A sag is generated for the third phase (output at the third phase output 535). This is accomplished by tapping the third winding 523. Here, the third winding 523 is tapped at C2 to generate the Type A sag. That tap on the third winding 523 is connected to the switch S6 so that when the sag condition is initiated, the Type A sag is generated on the third or C phase. In other embodiments, the Type A sag could be generated for the first or second (A or B) phases by tapping the second or first windings 522 and 521, similar to the tapping of the third winding 523 as shown in FIG. 5A. Such outputs would be sent to switch S4 or S5, respectively. A neutral line of the three phase input is connected to a neutral connection (X0) of the transformer 520. This is because, for any of the Type A sags generated on either of phases A, B, or C, the sag is a line-neutral sag. Because each of the legs is rated for line-neutral voltages or higher, the windings can be connected to different phases as desired.

FIG. 5B is a circuit diagram illustrating a sag generator device 500 with the three-phase wye-connected tapped auto-transformer 520 for generating a Type B voltage sag in accordance with an illustrative embodiment. Here, the first winding 521 on the center leg of the transformer 520 is used to generate a Type B sag. For Type B sags, two AC supply lines are connected to the transformer 520 across the full length of the first winding 521. In FIG. 5B, the second phase input 510 is connected to a first end of the first winding 521 (at H2), and the third phase input 515 is connected to a second end of the first winding 521 (H0). One of those ends (here the one the third phase is connected to at H0) is the neutral connection (X0) of the transformer. However, because a Type B sag (and Type C as discussed below) is a line-line sag, the input phases are connected across the first winding 521, and the input neutral is not connected to the transformer 520. Accordingly, a winding that is rated for the full line to line voltage should be used to generate a Type B or C sag.

To generate a Type B sag to the third phase output 535, the switch S6 is connected to a tap D2 on the first winding 521. In various embodiments, the first winding could be tapped anywhere to generate a Type B sag on the third phase. In various embodiments, the tap on the first winding 521 may instead be connected to switch S5 so that the sag is generated on the second phase output 530. In various embodiments, the other combinations of phase inputs may be connected to the first winding 521 so that various Type B sags for different phases may be generated.

FIG. 5C is a circuit diagram illustrating a sag generator device 500 with the three-phase wye-connected tapped auto-transformer 520 for generating a Type C voltage sag in accordance with an illustrative embodiment. In this illustrative embodiment, the taps are connected to the first winding 521 such that they are symmetrical about a midpoint of the first winding 521: the first tap connected at E1 and the second tap at D1 are located at approximately equal distances from the midpoint of the first winding 521. The taps at E1 and D1 are also located at approximately equal distances from H2 and H0, respectively. The taps at E2/D2, E3/D3, and E4/D4 are also connected such that they are symmetrical about the midpoint of the first winding 521. The symmetrical tap arrangement is used on the first winding 521 in order to produce Type C sags.

To produce a Type C sag the second phase input 510 is connected to a first end of the first winding 521 of the transformer 520 at H2. The third phase input 515 is connected to a second end of the first winding 521 at H0. Switch S5 is connected to the second phase output 530 and a position E2 on the first winding 521 of the transformer 520. Switch S6 is connected to the third phase output 535 and a position D2 on the first winding 521 of the transformer 520. The connections at E2 and D2 are taps of the first winding 521.

Accordingly, during a sag condition (when switches S4, S5, and S6 are on and S1, S2, and S3 are off), power from the second phase input 510 and the third phase input 515 pass through the first winding 521, out the first and second taps at E2 and D2, to the switches S5 and S6, and are output through the second phase output 530 and the third phase output 535. Such a configuration produces a Type C voltage sag with a magnitude reduction on both the second and third phases, as well as phase shifts on the second and third phases. During the normal condition, the three phase supply input is output through switches S1, S2, and S3 as the three phase supply output, such that there is no sag or phase shift generated for all three phases. In one or more embodiments, the first, second, and third phases may be varied so that different combinations of voltage sags on different phases may be generated.

Figure 5D:
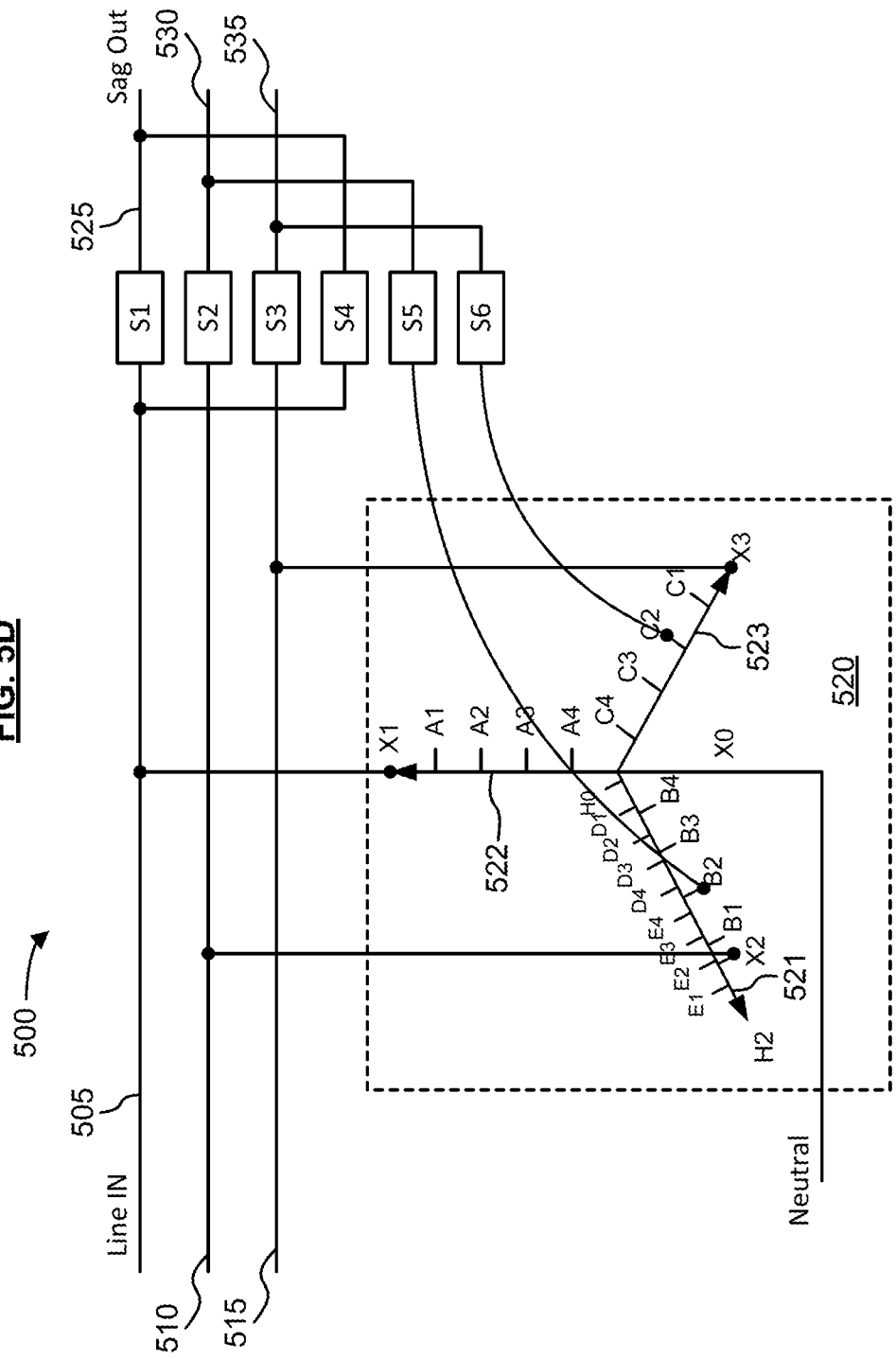
FIG. 5D is a circuit diagram illustrating a sag generator device with a three-phase wye-connected tapped auto-transformer for generating a Type D voltage sag in accordance with an illustrative embodiment.

FIG. 5D is a circuit diagram illustrating a sag generator device 500 with the three-phase wye-connected tapped auto-transformer 520 for generating a Type D voltage sag in accordance with an illustrative embodiment. The first phase input 505 is connected to the second winding 522 at a tap X1, the second phase input 510 is connected to the first winding 521 at a tap X2, and the third phase input 515 is connected to the third winding 523 at a tap X3. In FIG. 5D, a Type D sag is generated by reducing the magnitude on the second and the third phase outputs 530 and 535. This is accomplished by tapping the first winding 521 and the third winding 523. Here, the third winding 523 is tapped at C2 and the first winding 521 is tapped at B2 to generate the Type D sag. The tap on the third winding 523 is connected to the switch S6 and the tap on the first winding 521 is connected to the switch S5 so that when the sag condition is initiated, the Type D sag is generated on the second and third phases. In other embodiments, the Type D sags could be generated on different combinations of phases by tapping different windings and/or connecting the input phases to the windings differently. A neutral line of the three phase input is connected to a neutral connection (X0) of the transformer 520. This is because, for any of the Type D sags generated, the sag is a line-neutral sag. Because each of the legs is rated for line-neutral voltages or higher, the windings can connected to different phases as desired.

In another alternative embodiment, the device 500 may be used to generate a three phase sag. For example, the device 500 as shown in FIG. 5D may be modified as follows to generate a three phase line-to-neutral voltage magnitude reduction with no phase shift. First the connection between the first phase input 505 and the switch S4 is removed. Instead the switch S4 would be connected to a tap, such as A2, on the second winding 522 of the transformer 520. In this way, when the switches are controlled to switch into a sag condition, each of the output phases (A, B, and C) demonstrate a voltage magnitude reduction with no phase shift. This would be similar to the Type D sag shown above in FIG. 4, except all three vectors would have a voltage magnitude reduction, instead of just two vectors. In addition, each of the windings 521, 522, and 523 can be tapped, respectively, the same distance from the supply inputs, so that the voltage magnitude reduction on each phase is approximately the same.

Figure 6:
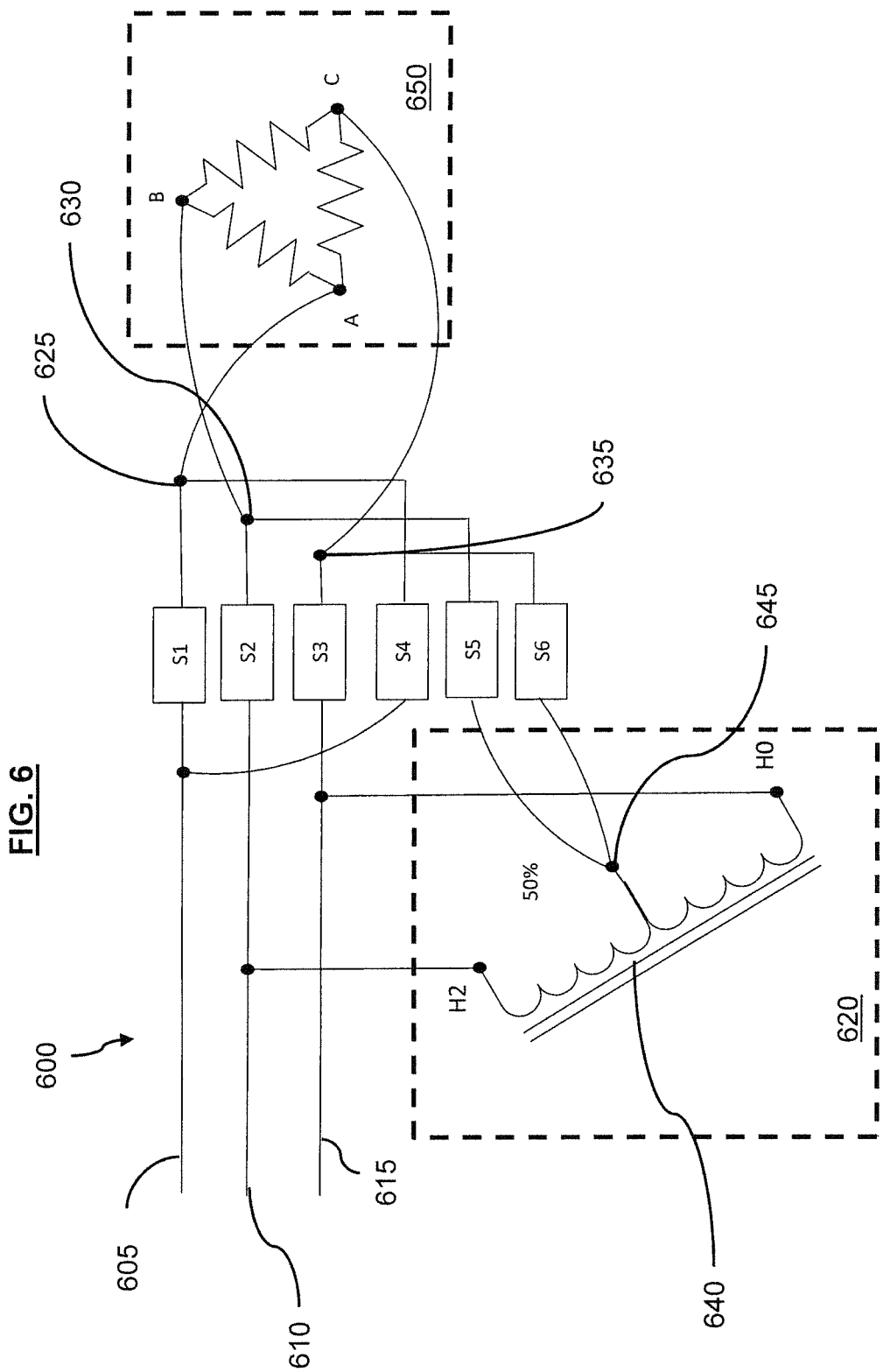
FIG. 6 is a circuit diagram illustrating a second sag generator device with a wye connected tapped auto-transformer for generating voltage sag in accordance with an illustrative embodiment.

FIG. 6 is a circuit diagram illustrating a second sag generator device 600 with a wye connected tapped auto-transformer for generating voltage sag in accordance with an illustrative embodiment. Only one winding of the transformer is shown in FIG. 6 for clarity. The device 600 is similar to the device 500, except that it generates a 0% voltage remaining sag (as opposed to the partial voltage remaining sag generated in FIG. 5C). The device 600 includes a three phase supply input including a first phase input 605, a second phase input 610, and a third phase input 615. The second and third phase inputs 610 and 615 are connected to opposite ends of a center-leg winding 640 of a wye connected auto-transformer 620, and the switches S5 and S6 are connected to the winding 640 at a midpoint 645 of the winding. Accordingly, the relative line-to-line voltage between the second and third phase is zero. A three phase supply output of the device includes a first phase output 625, a second phase output 630, and a third phase output 635. The three phase supply output is connected to a resistive three phase load 650.

Figure 7:
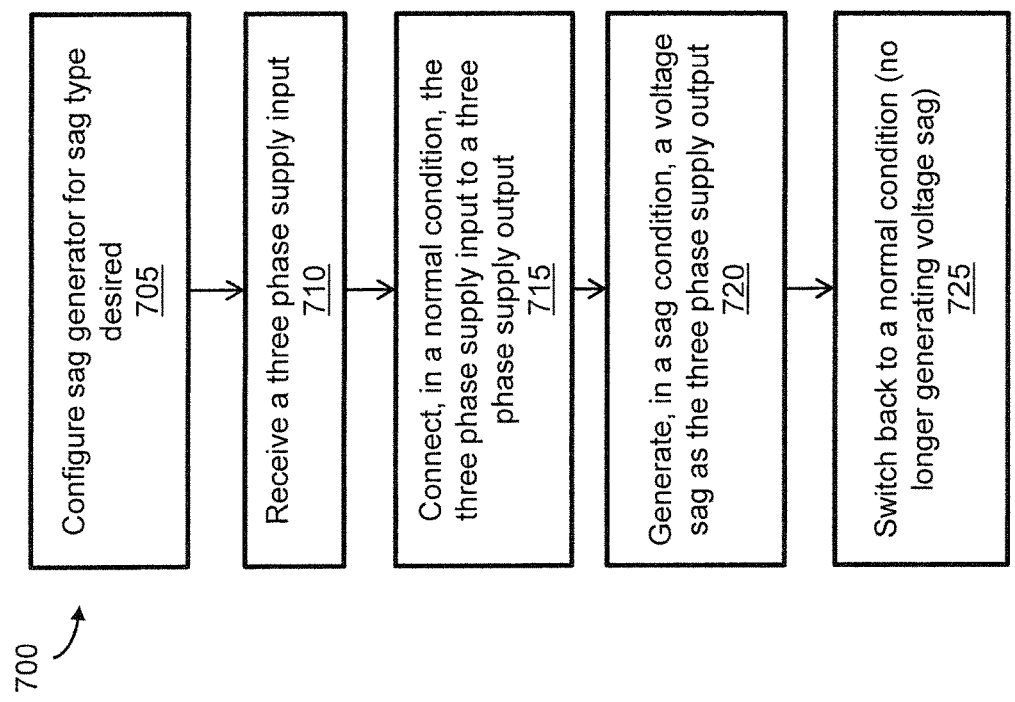
FIG. 7 is a flow chart illustrating a voltage sag generation process in accordance with an illustrative embodiment.

FIG. 7 is a flow chart illustrating a voltage sag generation process 700 in accordance with an illustrative embodiment. In alternative embodiments, fewer, additional, and/or different steps may be performed. Also, the use of a flow diagram is not meant to be limiting with respect to the order of steps performed. The process 700 may be practiced with various devices as disclosed herein, such as those shown and described with respect to FIGS. 5A-5D, 6, and 16. In an operation 705, a sag generator is configured for the sag type desired. For example, the sag generator may be configured to generate a Type A, B, C, D, or other type of sag as disclosed herein. In an operation 710, a three phase supply input is received.

In an operation 715, a three phase supply input is connected to a three phase supply output during a normal condition. For example, a sag generator may be connected to a piece of electrically powered machinery that is to be sag tested. Thus, the three phase supply input can be sent through the sag generator during the normal condition to the machinery. In an operation 720, a voltage sag is generated as the three phase supply output for a sag condition. This can be accomplished, for example by controlling switches, such as switches S1-S6 in FIGS. 5A-5D described above, to alternate between a sag condition and a normal condition. In an operation 725, the system is switched back to a normal condition, for example by appropriately controlling the switches S1-S6 again. Sags and sag testing usually only occurs for a short amount of time. In some embodiments, the switching back to a normal condition may happen automatically after a predetermined amount of time. In some embodiments, the switching may be done manually. The time during which a system is in a sag condition may vary or may be set according to a sag testing procedure.

FIGS. 8-15 show various values for a Type C sag generated with a sag generation device such as the one shown in FIG. 6 with a 0% line-to-line sag between two phases. Although various values and sags are possible, one embodiment of a generated sag is shown in FIGS. 8-15. In this example, the sags are generated with a load current of 910 A (Amps) rms (root mean square) and a nominal voltage of 480 Vac (voltage in alternating current).

Figure 8:
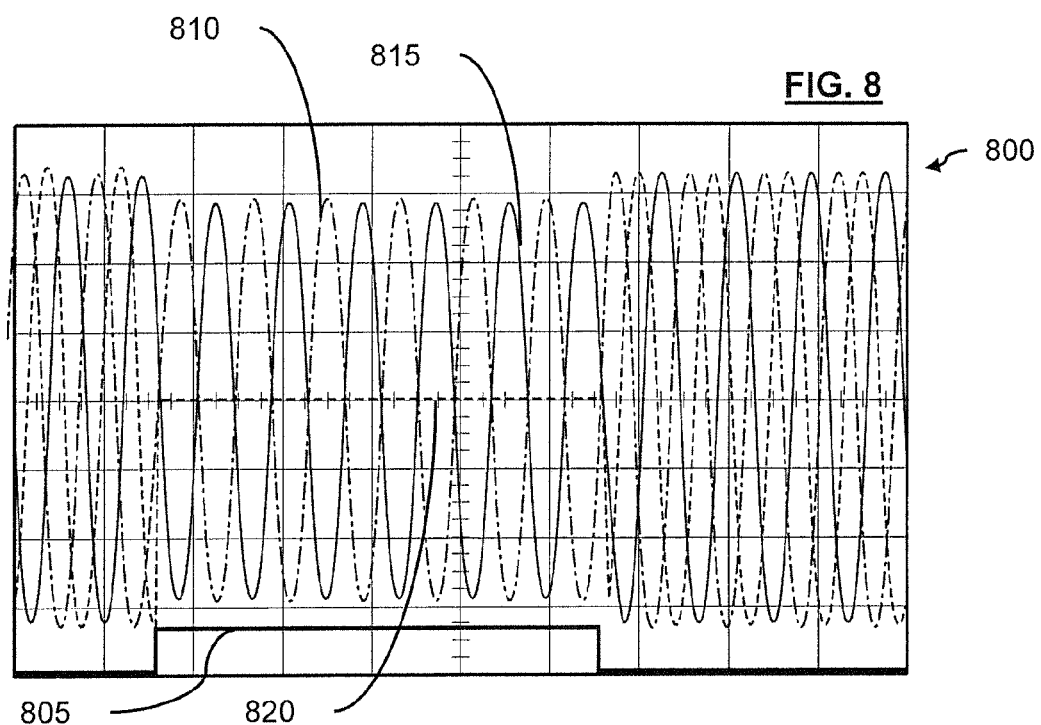
FIG. 8 is a graph illustrating a generated line-to-line voltage sag in accordance with an illustrative embodiment.

FIG. 8 is a graph 800 illustrating a generated line-to-line voltage sag in accordance with an illustrative embodiment. A line 805 of the graph of the graph 800 shows a switch value and is not shown on the same scale as the other lines of the graph 800. When the line 805 goes high, a sag generator device is switched to a sag condition, and when the line 805 is low, the sag generator device is in a normal condition. Lines 810, 815, and 820 show line-to-line voltages of a three phase supply output in the normal condition (when 805 is low) and the sag condition (when 805 is high). During the sag condition (when 805 is high), the line-to-line voltages between the first and second phases (line 810 or the phase A to phase B voltage) as well as the first and third phases (line 815 or the phase A to phase C voltage) are 415 Vac. The line-to-line voltage between the second and third phases (line 820 or the phase B to phase C voltage) is 0 Vac. The phase relationship between the lines 810 and 815 is 180 degrees during the sag condition.

Figure 9:
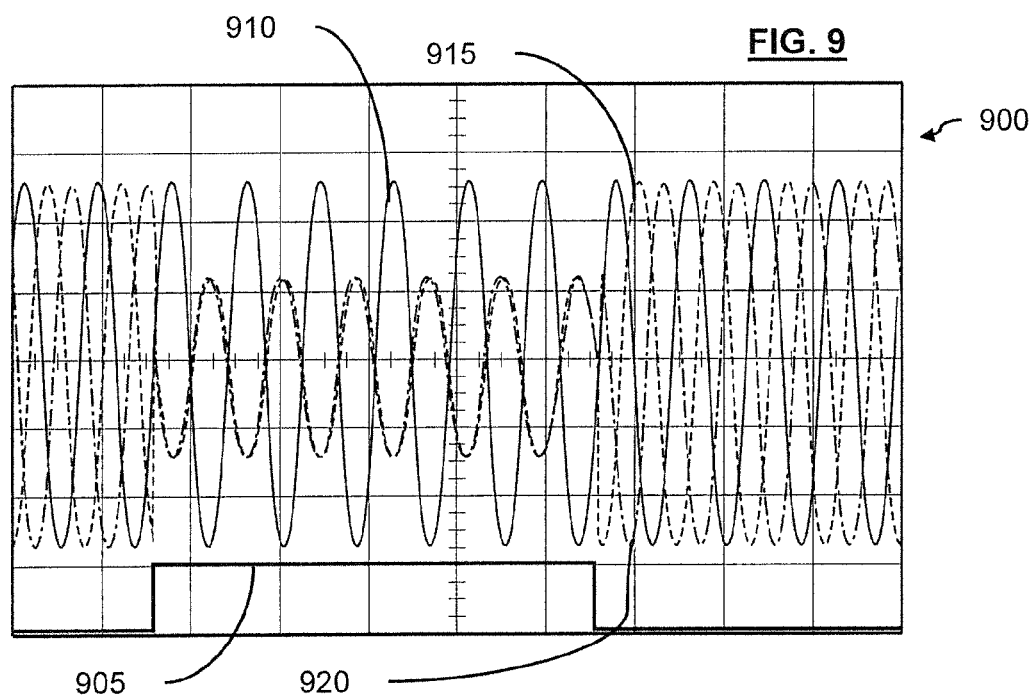
FIG. 9 is a graph illustrating load currents during a generated line-to-line voltage sag in accordance with an illustrative embodiment.

FIG. 9 is a graph 900 illustrating load currents during a generated line-to-line voltage sag in accordance with an illustrative embodiment. The graph 900 shows load currents of a three phase supply output when connected to a resistive load as shown in FIG. 6. The graph 900 includes a switch line 905 that is low during a normal condition and high during the sag condition. During the sag condition, the first phase current shown by line 910 does not change relative to the normal condition, and the current remains at 910 A rms. The current of the second and third phase supply outputs shown by lines 915 and 920 go down and are overlaid (the same) during the sag condition at 455 A rms.

Figure 10:
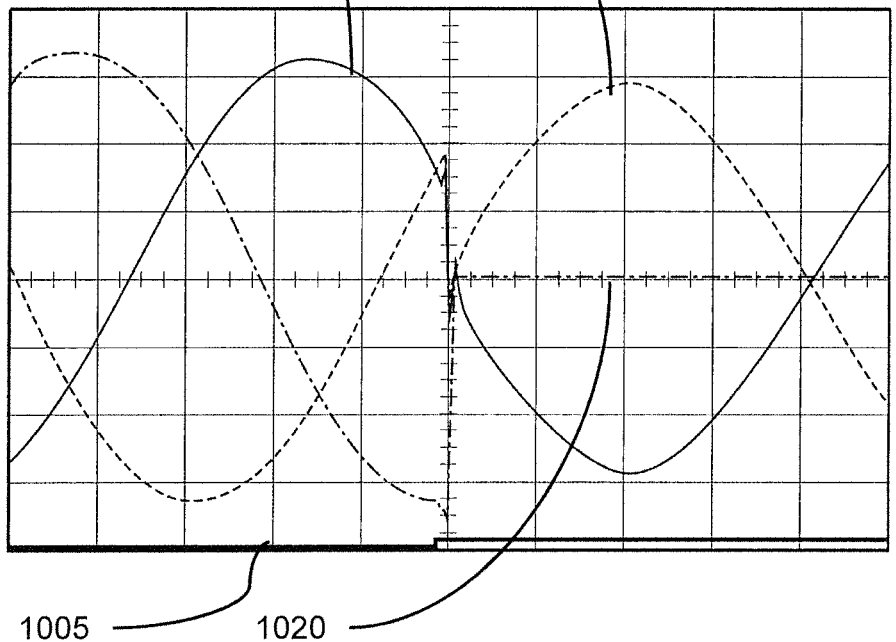
FIG. 10 is a graph illustrating a generated line-to-line voltage sag at an initiation of a sag in accordance with an illustrative embodiment.

FIG. 10 is a graph 1000 illustrating a generated line-to-line voltage sag at an initiation of a sag in accordance with an illustrative embodiment. The graph 1000 shows a similar graph to the graph 800, but shows a close up of voltages when the system is switched from a normal condition to a sag condition (i.e., at the initiation of a sag). A line 1005 shows a switch value. Lines 1010 and 1015 show line-to-line voltages between the first and second phases as well as between the first and third phases. A line 1020 shows a line-to-line voltage between the second and third phases.

Figure 11:
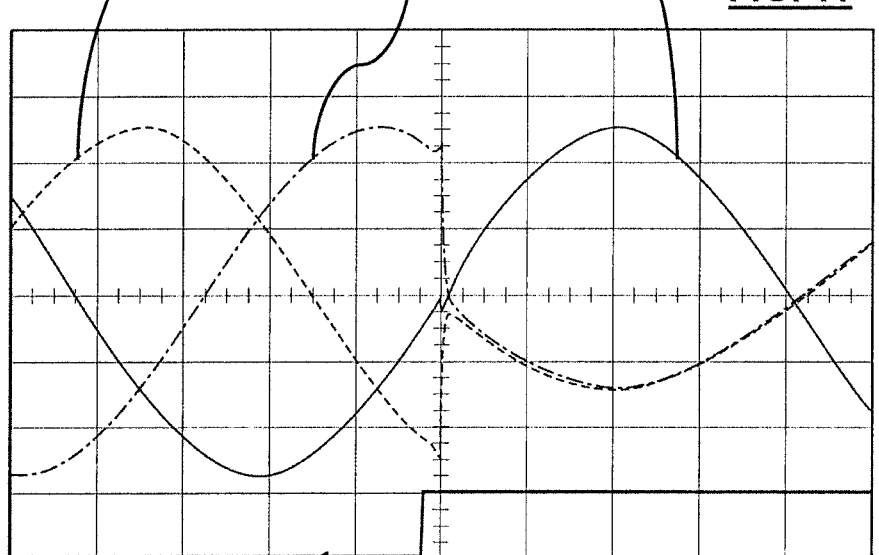
FIG. 11 is a graph illustrating load currents during a generated line-to-line voltage sag at an initiation of a sag in accordance with an illustrative embodiment.

FIG. 11 is a graph 1100 illustrating load currents during a generated line-to-line voltage sag at an initiation of a sag in accordance with an illustrative embodiment. The graph 1100 shows a similar graph to the graph 9000, but a close up of currents at initiation of sag. Line 1105 shows a switch value that switches a device between a normal condition and a sag condition. Line 1110 shows a current of a first phase that does not change during a sag condition. Lines 1115 and 1120 show currents of a second and third phase that get lower and coincide during a sag condition in this embodiment.

Figure 12:
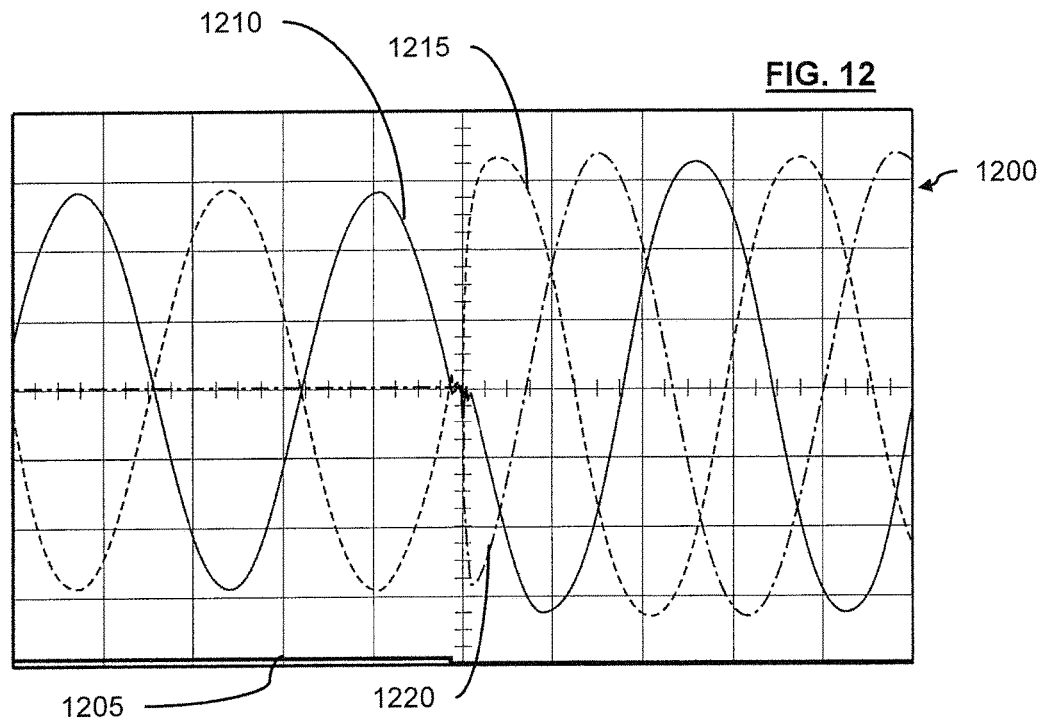
FIG. 12 is a graph illustrating a generated line-to-line voltage sag at an end of a sag in accordance with an illustrative embodiment.
Figure 13:
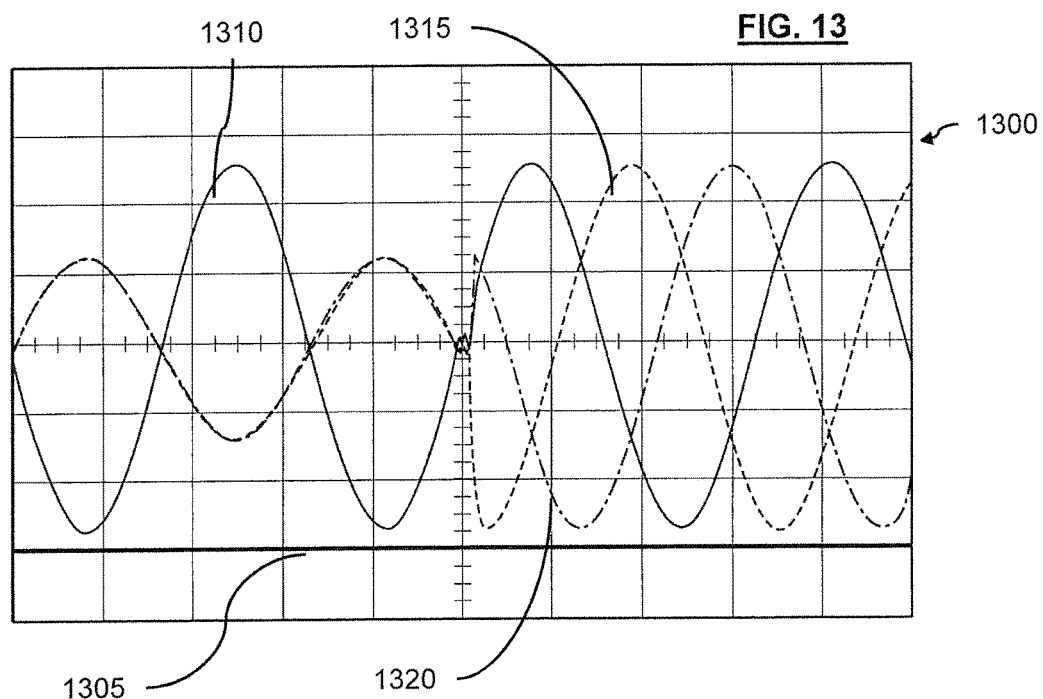
FIG. 13 is a graph illustrating load currents during a generated line-to-line voltage sag at an end of a sag in accordance with an illustrative embodiment.

FIG. 12 is a graph 1200 illustrating a generated line-to-line voltage sag at an end of a sag in accordance with an illustrative embodiment. FIG. 13 is a graph 1300 illustrating load currents during a generated line-to-line voltage sag at an end of a sag in accordance with an illustrative embodiment. FIGS. 12 and 13 are similar to FIGS. 10 and 11, except that instead of showing voltages and currents at an initiation of a sag, the graphs 1200 and 1300 show voltages and currents, respectively, at the end of a sag (when a device goes from a sag condition to a normal condition).

FIG. 14 is a graph 1400 illustrating an alternate view of a generated line-to-line voltage sag in accordance with an illustrative embodiment. The graph 1400 is similar to the graph 800, except that the phase voltages are separated for a different view. A line 1405 shows a switch value. A line 1410 shows a first phase to second phase line-to-line voltage. A line 1415 shows a second phase to third phase line-to-line voltage. A line 1420 shows a first phase to third phase line-to-line voltage.

FIG. 15 is a graph 1500 illustrating an alternate view of load currents during a generated line-to-line voltage sag in accordance with an illustrative embodiment. The graph 1500 is similar to the graph 900, except that the various phase load currents are separated. A line 1505 shows a switch value. A line 1510 shows a first phase load current. A line 1515 shows a second phase load current. A line 1520 shows a third phase load current.

Figure 16:
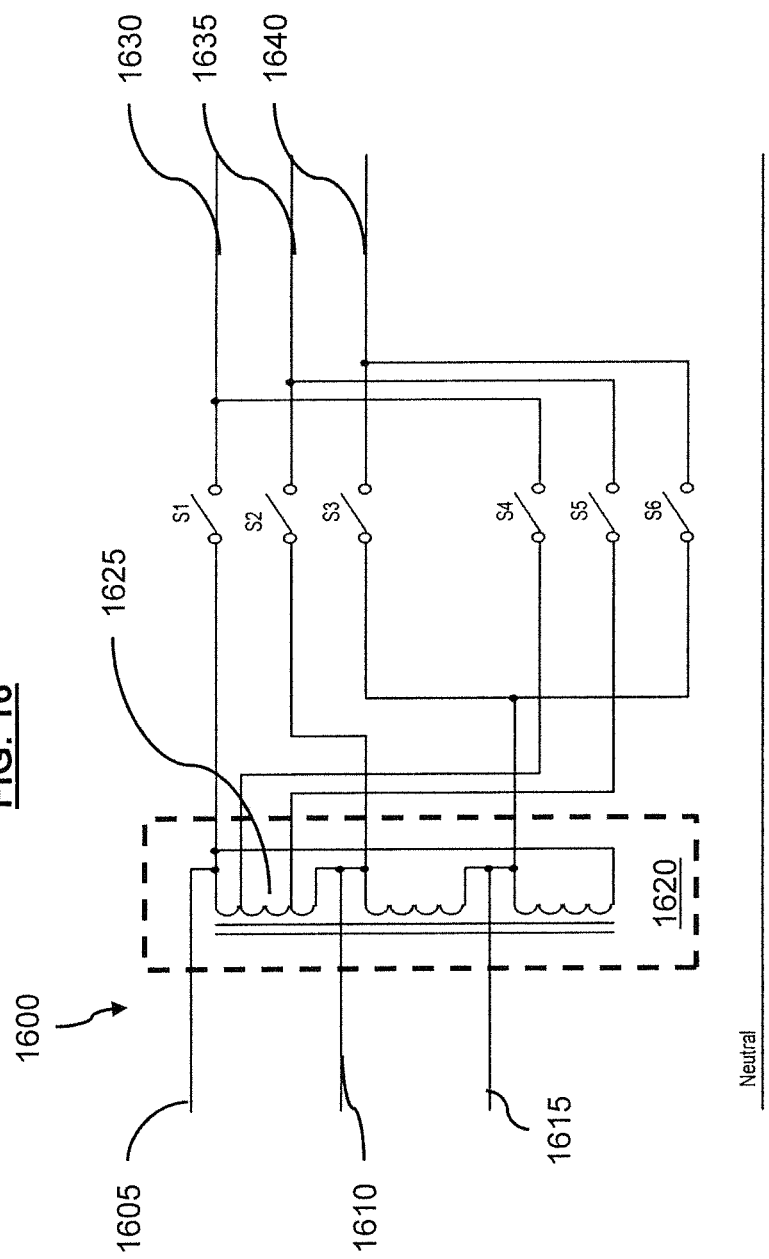
FIG. 16 is a circuit diagram illustrating a device with a delta wound tapped auto-transformer for generating voltage sag in accordance with an illustrative embodiment.

FIG. 16 is a circuit diagram 1600 illustrating a device with a delta wound tapped auto-transformer for generating voltage sag in accordance with an illustrative embodiment. A delta wound tapped auto-transformer 1620 may be used similar to wye-connected transformer of FIGS. 5 and 6 to generate a Type B or C sag. In this embodiment the winding 1625 has one set of taps that are spaced equally from the midpoint of the winding. Here the delta terminals are connected directly to a three phase supply input that includes a first supply input 1605, a second supply input 1610, and a third supply input 1615. A three phase supply output includes a first supply output 1630, a second supply output 1635, and a third supply output 1640. The first and second phase inputs 1605 and 1610 are connected across (and on opposite ends of) a winding 1625 of the transformer 1620. The taps of the winding 1625 are connected to switches S4 and S5. In a normal condition (switches S1, S2, and S3 are on while S4, S5, and S6 are off), the three phase supply input is passed directly to the three phase supply output. In a sag condition, the third phase input 1615 is passed directly to the third phase output 1640, while the first phase output 1630 and the second phase output 1635 are connected to the taps on the winding 1625. In this way, sagged and phase shifted voltages are output through the switches S4 and S5 to the first supply output 1630 and the second supply output 1635.

FIG. 17 is a graph illustrating simulated voltage results of a voltage sag generator in accordance with an illustrative embodiment. The graph shows simulation results for a 40% remaining sag for a Type C sag generated with a device such as that shown in FIG. 16 and described above. In this embodiment, the taps are 30% in from the respective ends of the A-B winding. The input waveforms 1700, 1705, and 1710 are normalized to 1 volt rms and are shown in the first display section. In other words, the input waveforms 1700, 1705, and 1710 show the three phase supply input. Waveforms 1701, 1706, and 1711 show line-to-neutral three phase output voltages during a sag condition. Waveforms 1701 and 1706 have reduced magnitude and their phase angle has shifted. Line-to-line voltage between the first and second phases during normal and sag conditions are shown by waveforms 1715 and 1720. The waveform 1720 shows the line-to-line voltage between the first and second phases before sag (during the normal condition). The waveform 1715 shows the line-to-line voltage between the first and second phases during sag (during a sag condition). The line-to-line voltage remains in the same phase during a sag condition but the magnitude has dropped to 40% remaining in this embodiment.

In an illustrative embodiment, any of the operations described herein including a controller can be implemented at least in part as computer-readable instructions stored on a computer-readable medium or memory. Upon execution of the computer-readable instructions by a processor, the computer-readable instructions can cause a computing device to perform the operations.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A device comprising:
   a three phase supply input comprising a first phase input, a second phase input, and a third phase input;
   a three phase supply output comprising a first phase output, a second phase output, and a third phase output; and
   a three-phase wye-connected auto-transformer having windings comprising a first winding, a second winding, and a third winding, wherein:

at least one of the windings is rated for at least a maximum line to line voltage of the three phase supply input, the other two windings are rated for at least a maximum line to neutral voltage of the three phase supply input, and one or more of the windings of the three-phase wye-connected auto-transformer are configured to be tapped to generate a voltage sag output as the three phase supply output.

2. The device of claim 1, wherein:

the first phase input is connected to the first phase output, the second phase input is connected to the second phase output, the third phase input is connected to a first tap of the third winding, a neutral line of the three phase supply input is connected to a neutral connection of the three-phase wye-connected auto-transformer, and the third phase output is connected to a second tap of the third winding between the neutral connection and the first tap of the third winding.

3. The device of claim 1, wherein:

the first winding is rated for at least the maximum line to line voltage of the three phase supply input, the first phase input is connected to the first phase output, the second phase input is connected to the second phase output and a first end of the first winding, the third phase input is connected to a second end of the first winding, and the third phase output is connected to a first tap of the first winding.

4. The device of claim 1, wherein:

the first winding is rated for at least the maximum line to line voltage of the three phase supply input, the first phase input is connected to the first phase output, the second phase input is connected to a first end of the first winding, the third phase input is connected to a second end of the first winding, the second phase output is connected to a first tap of the first winding, and the third phase output is connected to a second tap of the first winding, wherein the first tap and the second tap are located at approximately equal distances from a midpoint of the first winding.

5. The device of claim 1, wherein:

the first phase input is connected to the first phase output, the second phase input is connected to a first tap of the second winding, the third phase input is connected to a first tap of the third winding, a neutral line of the three phase supply input is connected to a neutral connection of the three-phase wye-connected auto-transformer, the second phase output is connected to a second tap of the second winding between the first tap of the second winding and the neutral connection, and the third phase output is connected to a second tap of the third winding between the first tap of the third winding and the neutral connection.

6. The device of claim 1, further comprising a plurality of switches configured to switch the three phase output between a normal condition and a sag condition, wherein the voltage sag is generated during the sag condition.

7. The device of claim 1, wherein the first winding is a center-leg of the three-phase wye-connected auto-transformer.

8. The device of claim 1, wherein:

the first phase input is connected to a first tap of the first winding, the second phase input is connected to a first tap of the second winding, the third phase input is connected to a first tap of the third winding, a neutral line of the three phase supply input is connected to a neutral connection of the three-phase wye-connected auto-transformer, the first phase output is connected to a second tap of the first winding between the first tap of the first winding and the neutral connection, the second phase output is connected to a second tap of the second winding between the first tap of the second winding and the neutral connection, and the third phase output is connected to a second tap of the third winding between the first tap of the third winding and the neutral connection.

9. A method comprising:

receiving a three phase supply input comprising a first phase input, a second phase input, and a third phase input;

generating, with a three-phase wye-connected auto-transformer, a voltage sag at a three phase supply output comprising a first phase output, a second phase output, and a third phase output, the three-phase wye-connected auto-transformer having windings comprising a first winding, a second winding, and a third winding, wherein:

at least one of the windings is rated for at least a maximum line to line voltage of the three phase supply input, the other two windings are rated for at least a maximum line to neutral voltage of the three phase supply input, and one or more of the windings of the three-phase wye-connected auto-transformer are tapped to generate the voltage sag.

10. The method of claim 9, wherein generating the voltage sag comprises generating a Type A sag such that:

the first phase input is connected to the first phase output, the second phase input is connected to the second phase output, the third phase input is connected to a first tap of the third winding, a neutral line of the three phase supply input is connected to a neutral connection of the three-phase wye-connected auto-transformer, and the third phase output is connected to a second tap of the third winding between the neutral connection and the first tap of the third winding.

11. The method of claim 9, wherein generating the voltage sag comprises generating a Type B sag such that:

the first winding is rated for at least the maximum line to line voltage of the three phase supply input, the first phase input is connected to the first phase output, the second phase input is connected to a first end of the first winding and the second phase output, the third phase input is connected to a second end of the first winding, and the third phase output is connected to a first tap of the first winding.

12. The method of claim 9, wherein generating the voltage sag comprises generating a Type C sag such that:
- the first winding is rated for at least the maximum line to line voltage of the three phase supply input,
- the first phase input is connected to the first phase output,
- the second phase input is connected to a first end of the first winding,
- the third phase input is connected to a second end of the first winding
- the second phase output is connected to a first tap of the first winding, and
- the third phase output is connected to a second tap of the first winding, wherein the first tap and the second tap are located at approximately equal distances from a midpoint of the first winding.

13. The method of claim 9, wherein generating the voltage sag comprises generating a Type D sag such that:
- the first phase input is connected to the first phase output,
- the second phase input is connected to a first tap of the second winding,
- the third phase input is connected to a first tap of the third winding,
- a neutral line of the three phase supply input is connected to a neutral connection of the three-phase wye-connected auto-transformer,
- the second phase output is connected to a second tap of the second winding between the first tap of the second winding and the neutral connection, and
- the third phase output is connected to a second tap of the third winding between the first tap of the third winding and the neutral connection.

14. The method of claim 9, wherein generating the voltage sag comprises generating a three-phase sag such that:
- the first phase input is connected to a first tap of the first winding,
- the second phase input is connected to a first tap of the second winding,
- the third phase input is connected to a first tap of the third winding,
- a neutral line of the three phase supply input is connected to a neutral connection of the three-phase wye-connected auto-transformer,
- the first phase output is connected to a second tap of the first winding between the first tap of the first winding and the neutral connection,
- the second phase output is connected to a second tap of the second winding between the first tap of the second winding and the neutral connection, and
- the third phase output is connected to a second tap of the third winding between the first tap of the third winding and the neutral connection.

15. A non-transitory computer readable medium having instructions stored thereon that, upon execution by a computing device, cause the computing device to perform operations, wherein the instructions comprise:
- instructions to receive a three phase supply input comprising a first phase input, a second phase input, and a third phase input;
- instructions to give commands to a set of switches to generate, with a three-phase wye-connected auto-transformer, a voltage sag as a three phase supply output comprising a first phase output, a second phase output, and a third phase output, the three-phase wye-connected auto-transformer having windings comprising a first winding, a second winding, and a third winding, wherein:
  - at least one of the windings is rated for at least a maximum line to line voltage of the three phase supply input,
  - the other two windings are rated for at least a maximum line to neutral voltage of the three phase supply input, and
  - one or more of the windings of the three-phase wye-connected auto-transformer are tapped to generate the voltage sag.

16. The non-transitory computer readable medium of claim 15, wherein instructions to generate the voltage sag further comprise instructions to generate a Type A sag such that:
- the first phase input is connected to the first phase output,
- the second phase input is connected to the second phase output,
- the third phase input is connected to a first tap of the third winding,
- a neutral line of the three phase supply input is connected to a neutral connection of the three-phase wye-connected auto-transformer, and
- the third phase output is connected to a second tap of the third winding between the neutral connection and the first tap of the third winding.

17. The non-transitory computer readable medium of claim 15, wherein instructions to generate the voltage sag further comprise instructions to generate a Type B sag such that:
- the first winding is rated for at least the maximum line to line voltage of the three phase supply input,
- the first phase input is connected to the first phase output,
- the second phase input is connected to a first end of the first winding and the second phase output,
- the third phase input is connected to a second end of the first winding, and
- the third phase output is connected to a first tap of the first winding.

18. The non-transitory computer readable medium of claim 15, wherein instructions to generate the voltage sag further comprise instructions to generate a Type C sag such that:
- the first winding is rated for at least the maximum line to line voltage of the three phase supply input,
- the first phase input is connected to the first phase output,
- the second phase input is connected to a first end of the first winding,
- the third phase input is connected to a second end of the first winding
- the second phase output is connected to a first tap of the first winding, and
- the third phase output is connected to a second tap of the first winding, wherein the first tap and the second tap are located at approximately equal distances from a midpoint of the first winding.

19. The non-transitory computer readable medium of claim 15, wherein instructions to generate the voltage sag further comprise instructions to generate a Type D sag such that:
- the first phase input is connected to the first phase output,
- the second phase input is connected to a first tap of the second winding,
- the third phase input is connected to a first tap of the third winding,
- a neutral line of the three phase supply input is connected to a neutral connection of the three-phase wye-connected auto-transformer, the second phase output is connected to a second tap of the second winding between the first tap of the second winding and the neutral connection, and the third phase output is connected to a second tap of the third winding between the first tap of the third winding and the neutral connection.

20. The non-transitory computer readable medium of claim 15, wherein instructions to generate the voltage sag further comprise instructions to generate a three phase voltage sag such that:

the first phase input is connected to a first tap of the first winding, the second phase input is connected to a first tap of the second winding, the third phase input is connected to a first tap of the third winding, a neutral line of the three phase supply input is connected to a neutral connection of the three-phase wye-connected auto-transformer, the first phase output is connected to a second tap of the first winding between the first tap of the first winding and the neutral connection, the second phase output is connected to a second tap of the second winding between the first tap of the second winding and the neutral connection, and the third phase output is connected to a second tap of the third winding between the first tap of the third winding and the neutral connection.

\* \* \* \* \*